(12) United States Patent
Jin et al.

(10) Patent No.: US 8,860,228 B2
(45) Date of Patent: Oct. 14, 2014

(54) ELECTRONIC DEVICE INCLUDING ELECTRICALLY CONDUCTIVE VIAS HAVING DIFFERENT CROSS-SECTIONAL AREAS AND RELATED METHODS

(71) Applicant: STMicroelectronics Pte. Ltd, Singapore (SG)

(72) Inventors: Yonggang Jin, Singapore (SG); Yun Liu, Singapore (SG); Yaohuang Huang, Singapore (SG)

(73) Assignee: STMicroelectronics Pte. Ltd., Singapore (SG)

( * ) Notice: Subject to any disclaimer, the term of this patent is extended or adjusted under 35 U.S.C. 154(b) by 74 days.

(21) Appl. No.: 13/727,206

(22) Filed: Dec. 26, 2012

(65) Prior Publication Data

US 2014/0175649 A1 Jun. 26, 2014

(51) Int. Cl.
*H01L 23/48* (2006.01)
*H01L 21/768* (2006.01)

(52) U.S. Cl.
CPC ........ *H01L 23/481* (2013.01); *H01L 21/76805* (2013.01)
USPC ....................................................... 257/774

(58) Field of Classification Search
USPC .......................................... 257/774, E23.145
See application file for complete search history.

(56) References Cited

U.S. PATENT DOCUMENTS

| 6,037,664 A * | 3/2000 | Zhao et al. ..................... 257/758 |
| 8,178,953 B2 | 5/2012 | Barth et al. |
| 2010/0078789 A1 | 4/2010 | Choi et al. |
| 2011/0210452 A1 | 9/2011 | Roozeboom et al. |
| 2012/0001337 A1* | 1/2012 | Tsai et al. ...................... 257/770 |
| 2012/0049370 A1* | 3/2012 | Wada et al. ................... 257/751 |
| 2012/0098114 A1 | 4/2012 | Ishibashi |

* cited by examiner

*Primary Examiner* — Thao P Le
(74) *Attorney, Agent, or Firm* — Allen, Dyer, Doppelt, Milbrath & Gilchrist, P.A.

(57) ABSTRACT

An electronic device may include a bottom interconnect layer having a first electrically conductive via therein. The electronic device may also include an integrated circuit (IC) carried by said bottom interconnect layer, and an encapsulation material on the bottom interconnect layer and surrounding the IC. The encapsulation layer may have a second electrically conductive via therein aligned with the first electrically conductive via. The second electrically conductive via may have a cross-sectional area larger than a cross-sectional area of the first electrically conductive via.

24 Claims, 5 Drawing Sheets

ELECTRONIC DEVICE INCLUDING ELECTRICALLY CONDUCTIVE VIAS HAVING DIFFERENT CROSS-SECTIONAL AREAS AND RELATED METHODS

FIELD OF THE INVENTION

The present invention related to the field of electronic devices and, more particularly to the field of integrated circuit carrying electronic devices, and related methods.

BACKGROUND OF THE INVENTION

As demands for a smaller electronic device increase, so do the demands for electronic device packages to meet size demands and production efficiency. One method of making a reduced size electronic device is a package-on-package (PoP) method.

The PoP method is an integrated circuit (IC) packaging method that combines vertically discrete components or elements, for example, logic and memory ball grid array (BGA) packages. Two or more packages may be installed on top of each other, i.e. stacked, with an interface to route signals between them. This may allow higher component density in an electronic device, such as, for example, a mobile phone, a personal digital assistant (PDA), and a digital camera.

While the PoP process may be particularly beneficial for space savings in an electronic device, the PoP process may be particularly beneficial as components may be decoupled. In particular, a memory device, for example, may be decoupled from a logic device. Thus, the memory device may be tested separately from the logic device, and only those devices that are operational may be used in final assembly (if the memory is non-operational, only the memory may be discarded). This is in contrast to stacked-die packages, for example, where the entire set of components or devices is rejected if either the memory or logic device is non-operational.

Additionally, a manufacturer of a mobile phone or a digital camera, for example, may control logistics. In other words, one component, for example, the memory, from different suppliers or manufacturers can be used at different times without changing the logic.

Moreover, any mechanically mating top package can typically be used. For example, for a relatively simple mobile phone, a smaller memory configuration may be used on the top package, while for a more complex smartphone, more memory could be used with the same bottom package. This may simplify inventory control by the original equipment manufacturers (OEM). In contrast, for a stacked-die package or even package in package (PiP), the exact memory configuration must be known well in advance.

Electrically, the PoP method may advantageously reduce a length of electrical interconnections (i.e., track length) between different interoperating parts, such as, for example, a controller and a memory. This may improve electrical performance of devices, since shorter routing of interconnections between circuits may yield faster signal propagation and reduced noise and cross-talk. However, electrical interconnections are typically formed at the package level at the surface mounting stage, which may reduce production efficiency, for example.

U.S. Patent Application Publication No. 2011/0210452 to Roozeboom et al. discloses a semiconductor device for use in a stacked configuration. The semiconductor device includes a substrate having at least part of an electronic circuit provided at a first side thereof. The substrate includes a passivation layer at the first side and has a substrate via that extends from the first side to a via depth beyond a depth of the electronic circuit such that it is reconfigurable into a through-substrate via by backside thinning of the substrate. A patterned masking layer is on the first side of the substrate, wherein the patterned masking layer includes a trench extending fully through the patterned masking layer and being filled with a redistribution conductor. The substrate via and the redistribution conductor includes metal paste and together form one piece.

Further improvements to electronic device packages and methods, for example, PoP packaging, may be desired. More particularly, it may be desirable to increase production efficiency.

SUMMARY OF THE INVENTION

In view of the foregoing background, it is therefore an object of the present invention to provide an electronic device that is relatively thin and readily manufactured.

This and other objects, features, and advantages in accordance with the present invention are provided by an electronic device that may include a bottom interconnect layer having a first electrically conductive via therein. The electronic device may also include an integrated circuit (IC) carried by the bottom interconnect layer, and an encapsulation material on the bottom interconnect layer and surrounding the IC. The encapsulation layer may have a second electrically conductive via therein aligned with the first electrically conductive via. The second electrically conductive via may have a cross-sectional area larger than a cross-sectional area of the first electrically conductive via. Accordingly, the electronic device may have a reduced thickness and may be manufactured with increased efficiency. For example, fewer alignment steps may be used during stacking.

The first electrically conductive via may have a cross-sectional area in a range of 31,000-49,000 square microns. The second electrically conductive via may have a cross-sectional area in a range of 49,000-97,000 square microns, for example.

The IC may include a semiconductor substrate having a plurality of bond pads coupled to the bottom interconnect layer. The encapsulation material may include thermosetting polymer, for example. The first and second electrically conductive vias may include a tin/lead alloy, for example.

The bottom interconnect layer may include a plurality of dielectric layers and at least one electrically conductive layer associated therewith. The at least one electrically conductive layer may include a plurality of electrically conductive layers, for example.

The electronic device may further include a plurality of bottom contacts carried by the bottom interconnect layer. The electronic device may further include an IC package that may include a plurality of electrically conductive contacts coupled to respective ones of the first and second electrically conductive vias, for example.

A method aspect is directed to a method of making an electronic device. The method may include coupling an integrated circuit (IC) to a bottom interconnect layer and forming a first electrically conductive via in the bottom interconnect layer. The method may further include positioning an encapsulation material on the bottom interconnect layer to surround the IC. The method may also include forming a second electrically conductive via in the encapsulation material aligned with the first electrically conductive via, the second electrically conductive via having a cross-sectional area being larger than a cross-sectional area of the first electrically conductive via.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to refer to like elements in different embodiments.

Figure 1:
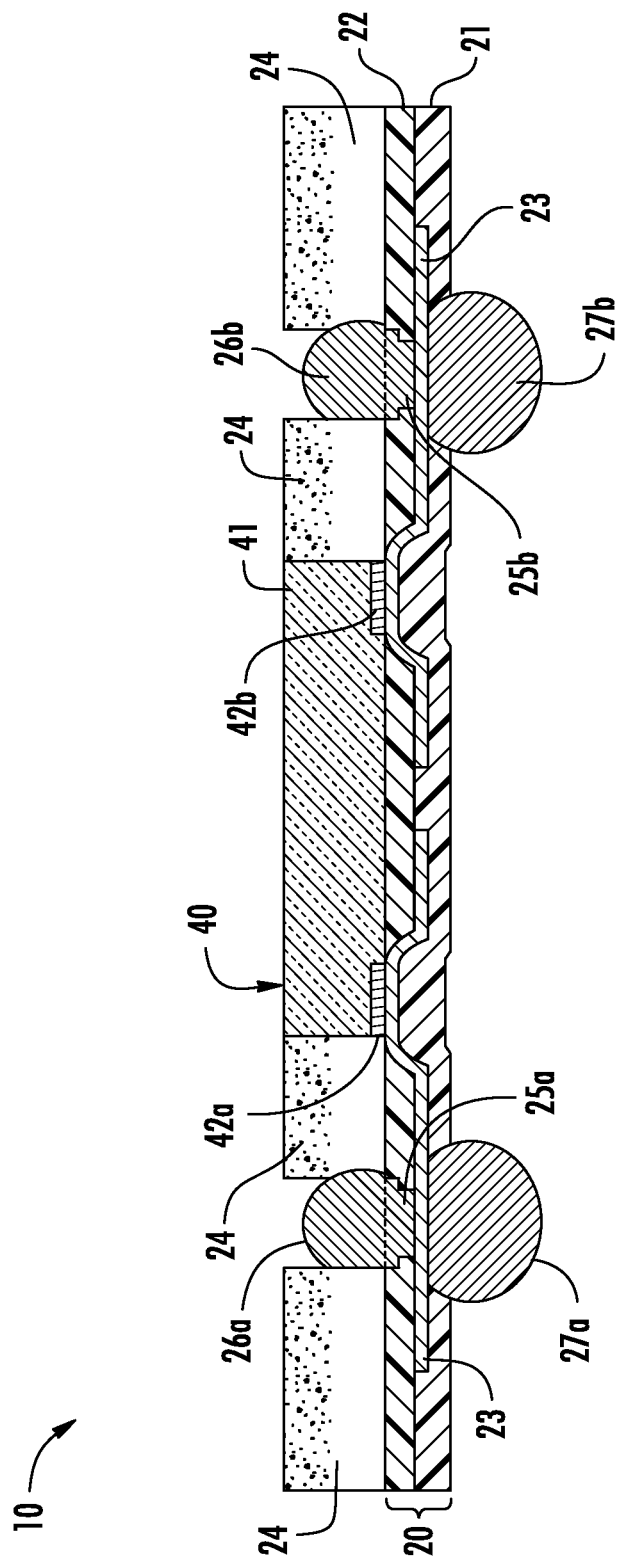
FIG. 1 is an enlarged schematic cross-sectional view of an electronic device in accordance with the present invention.
Figure 2:
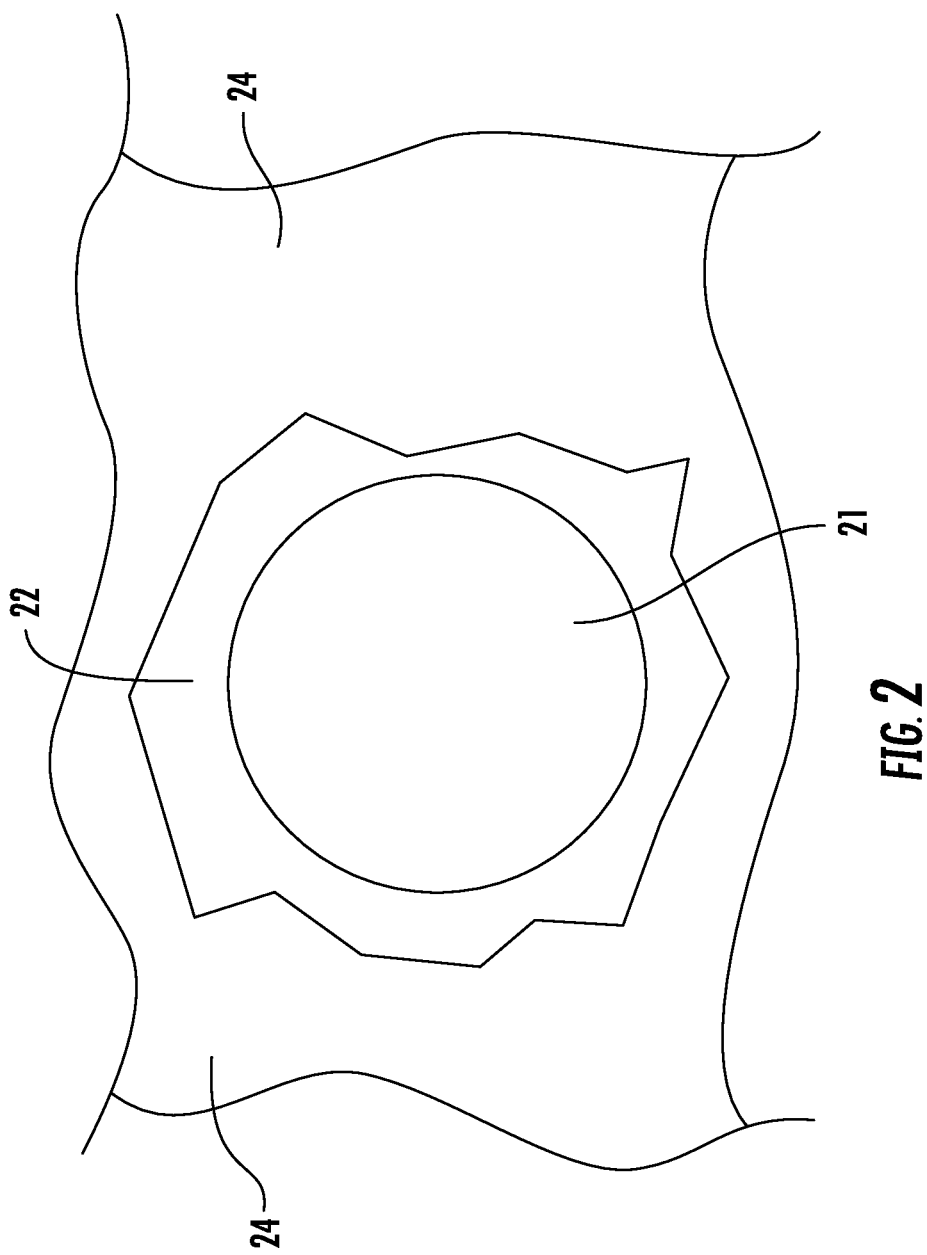
FIG. 2 is an enlarged top-view of a portion of the electronic device of FIG. 1 with the first and second electrically conductive vias removed.

Referring initially to FIGS. 1 and 2, an electronic device 10 illustratively includes a bottom interconnect layer 20. The bottom interconnect layer 20 has first and second dielectric layers 21, 22 in a stacked relation. An electrically conductive layer 23 defining a redistribution layer (RDL) is associated with the first and second dielectric layers 21, 22. More particularly, the electrically conductive layer 23 is carried between the first and second dielectric layers 21, 22, and extends to an upper surface of the second dielectric layer.

The electronic device 10 includes an integrated circuit (IC) 40 carried by bottom interconnect layer 20. More particularly, the IC 40 is carried by an upper surface of the second dielectric layer 22 and couples to the bottom interconnect layer 20 at the upper surface of the second dielectric layer. More particularly, the IC 40 illustratively includes a semiconductor substrate 41 and bond pads 42a, 42b coupled to the electrically conductive layer 23.

The bottom interconnect layer 20 has first electrically conductive vias 25a, 25b therein. More particularly, the first electrically conductive vias 25a, 25b extend through the second dielectric layer 22 to couple to the electrically conductive layer 23. The first electrically conductive vias 25a, 25b may each include a tin/lead alloy, for example, a solder paste. Of course, the first electrically conductive vias 25a, 25b may include other or additional metals.

An encapsulation material 24 is on the bottom interconnect layer 20 and surrounds the IC 40. The encapsulation layer 24 may include a thermosetting polymer or epoxy, for example. Of course, the encapsulation layer 24 may include another type of dielectric material. The encapsulation layer 24 has second electrically conductive vias 26a, 26b therein aligned with first electrically conductive vias 25a, 25b. More particularly, the second electrically conductive vias 26a, 26b are each vertically aligned with respective first electrically conductive via 25a, 25b. The second electrically conductive vias 26a, 26b may each include a tin/lead alloy, for example, a solder paste. Of course, the second electrically conductive vias 26a, 26b may include other or additional metals.

The second electrically conductive vias 26a, 26b each have a cross-sectional area larger than a respective cross-sectional area of the first electrically conductive vias 25a, 25b. For example, the first electrically conductive vias 25a, 25b may each have a cross-sectional area in a range of 31,000-49,000 square microns, while the second electrically conductive vias 26a, 26b may each have a cross-sectional area in a range of 49,000-97,000 square microns, although other cross-sectional areas may also be used. Accordingly, the relative cross-sectional areas of the first and second electrically conductive vias create the appearance of a "step" of the second dielectric layer 22.

Moreover, surfaces of the encapsulation material 24 adjacent each second electrically conductive via 26a, 26b may be irregularly shaped, but form a generally closed shape (FIG. 2). The irregular shape may be a result of a first type of laser used for forming the respective openings in the encapsulation material 24 for the second electrically conductive vias 26a, 26b, for example. Surfaces of the second dielectric layer 22 adjacent each first electrically conductive via 25a, 25b may have a more regular shape or may form a smooth rounded shape, for example (FIG. 2). The more regular shape may be based upon a second different type of laser used for forming the respective openings in the second dielectric layer 22.

The two different cross-sectional areas of the first and second electrically conductive vias 25a, 26a, 25b, 26b, may increase the overall quality of the electronic device 10. As will be appreciated by those skilled in the art, the first and second electrically conductive vias 25a, 26a, 25b, 26b, upon reflowing, together have an ovoid shape, and may, in some instances, have a spherical shape. The first electrically conductive vias 25a, 25b each have an irregular shape because of the composition of the encapsulation material 24. In contrast, the second electrically conductive vias 26a, 26b each have a more regular shape, for example, circular, because of the composition of the second dielectric layer 22. The first and second electrically conductive vias 25a, 26a, 25b, 26b may aid in alignment of the packages during assembly, as will be appreciated by those skilled in the art. The first and second electrically conductive vias 25a, 26a, 25b, 26b together may have a height of about 200-500 microns. Moreover, while two pairs of first and second electrically conductive vias are illustrated, it will be appreciated by those skilled in the art that any number of pairs of first and second electrically conductive vias may be used.

In some embodiments, the electronic device 10 further includes bottom contacts 27a, 27b carried by the bottom interconnect layer 20 and aligned with the first and second electrically conductive vias 25a, 26a, 25b, 26b, respectively. The bottom contacts 27a, 27b may each be electrically conductive balls defining a ball grid array, for example. Of course, the bottom contacts 27a, 27b may be another type of contact. The bottom contacts 27a, 27b may be for coupling to a printed circuit board (PCB) or other IC package, as will be appreciated by those skilled in the art.

A further electronic device or IC package may be coupled to an upper surface of the electronic device, and more particularly, the second electrically conductive vies. As will be described in further detail below, the further electronic device may be one or more electronic devices 10 described above.

Figure 3:
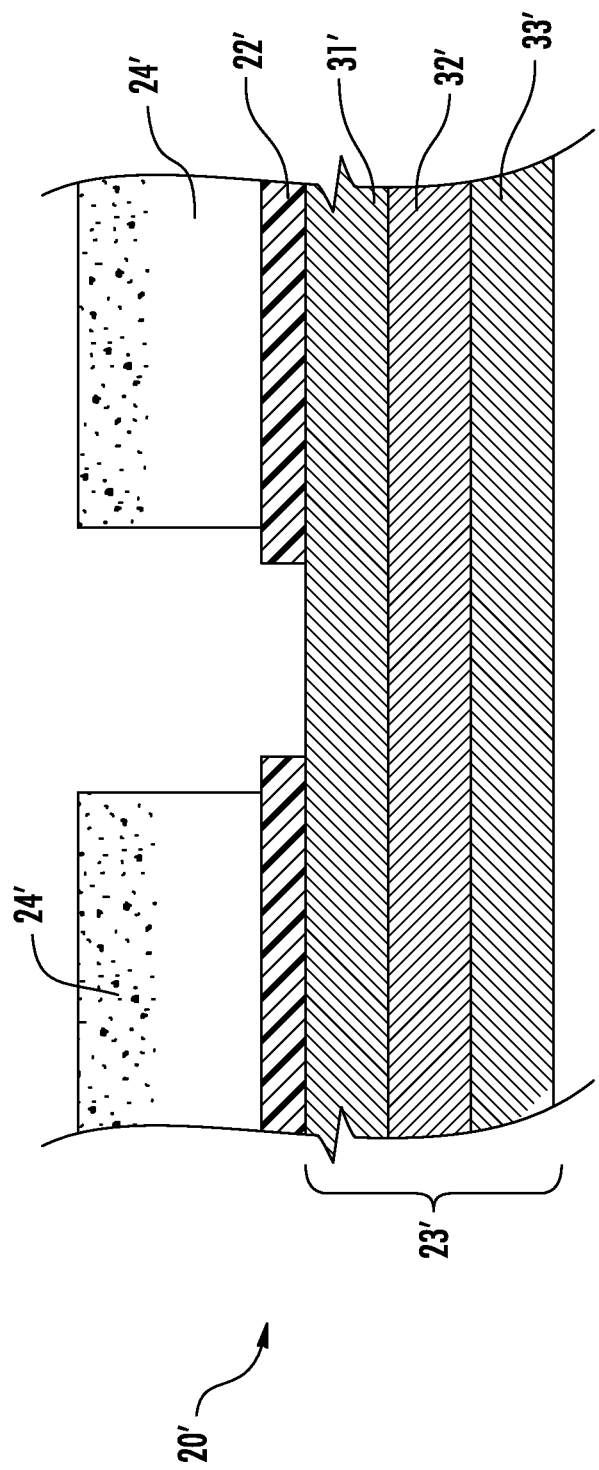
FIG. 3 is an enlarged schematic cross-sectional view of a portion of an electronic device according to another embodiment of the present invention.

Referring now to FIG. 3, in another embodiment, the bottom interconnect layer 20' may include a multi-layer electrically conductive layer 23'. The multi-layer electrically conductive layer 23' illustratively includes a first or top electrically conductive layer 31', for example, a plated copper layer. A second electrically conductive layer 32' is coupled to a lower surface of the top electrically conductive layer 31'. The second electrically conductive layer 32' may be, for example, a plated nickel layer. A third or bottom electrically conductive layer 33', is coupled to a lower surface of the second electrically conductive layer 32'. The third electrically conductive layer 33' may be, for example, another plated copper layer. Of course, more or less layers may be used, and may include other or additional metals.

As will be appreciated by those skilled in the art, the multi-layer electrically conductive layer 23' advantageously increases reliability of the electronic device 10'. More particularly, the diffusion rate of the solder is relatively low if the copper is fully diffused to the solder or the first and second electrically conductive vias. The copper and nickel cooperate to form an intermetallic compound, copper-nickel-copper, which forms an increasingly reliable electrical connection.

Figure 4:
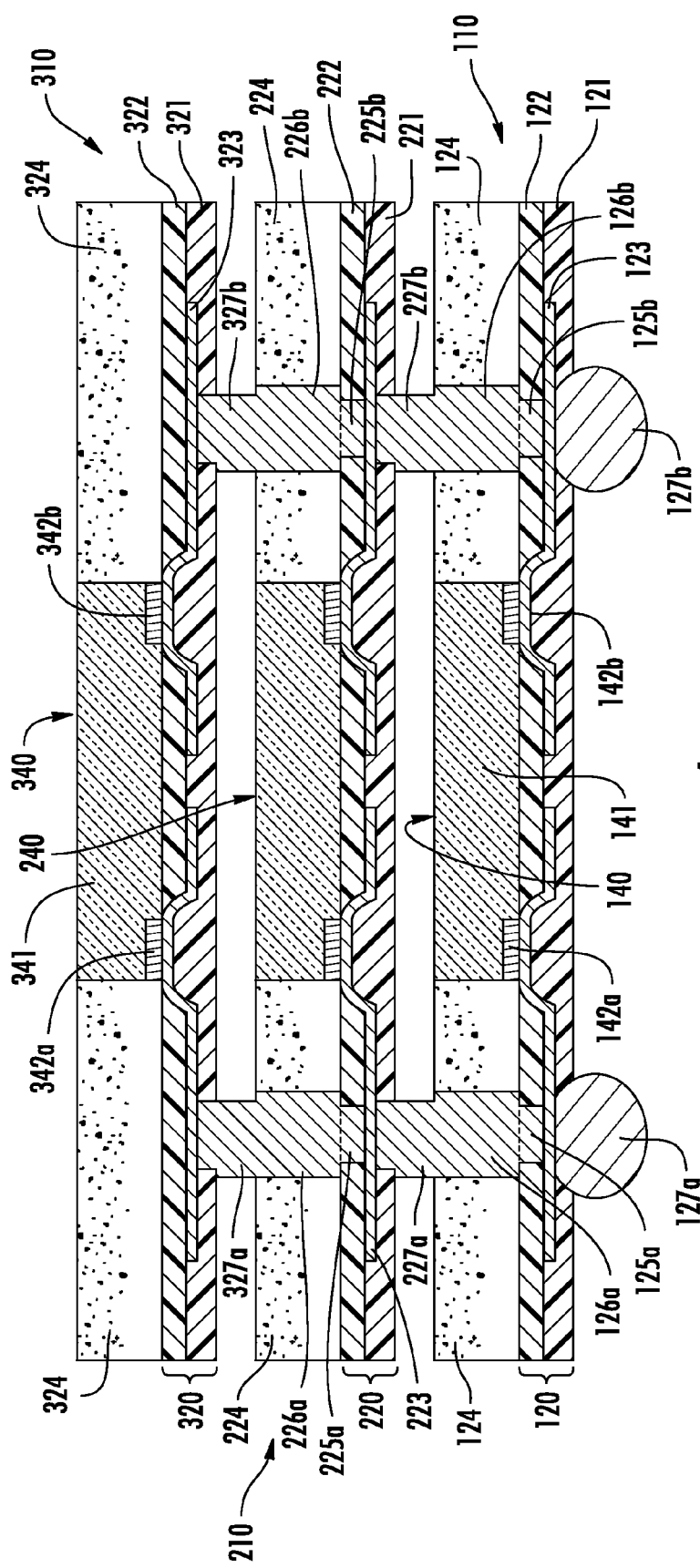
FIG. 4 is an enlarged schematic cross-sectional view of a stack-up of electronic devices according to an embodiment of the present invention.
Figure 5A:
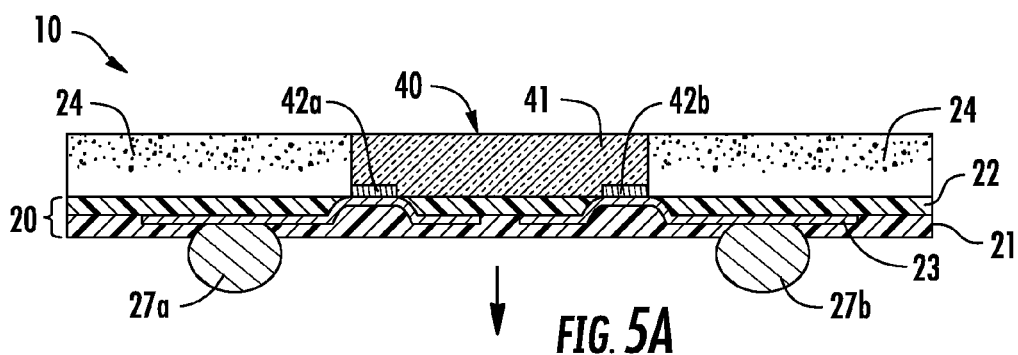
FIG. 5 is a series of schematic cross-sectional views illustrating a method of making the electronic device of FIG. 1.
Figure 5B:
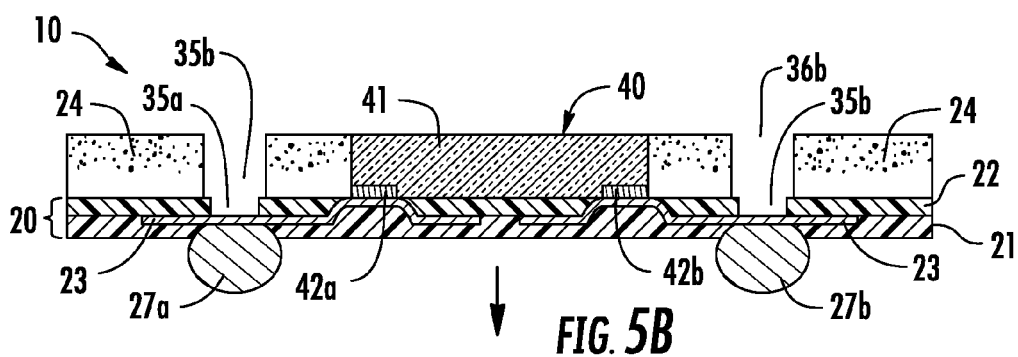
Figure 5C:
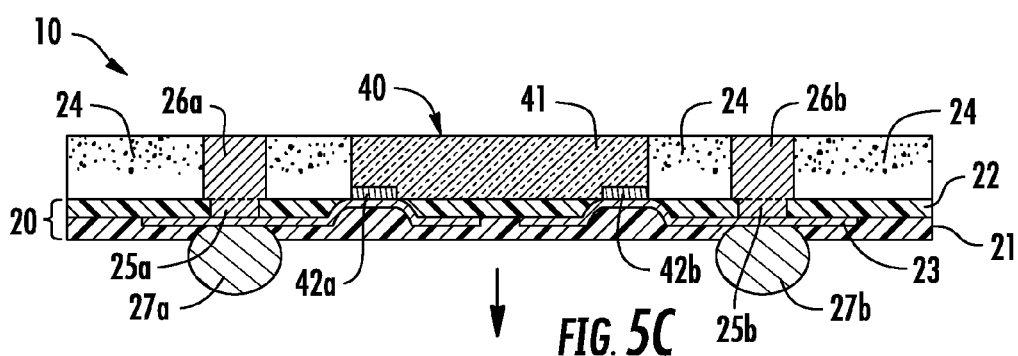
Figure 5D:
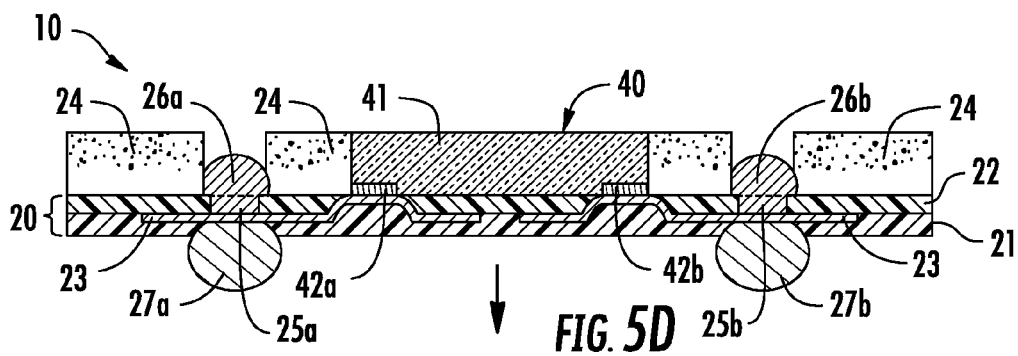

Referring now to FIG. 4, more than one electronic device 110, 210, 310 may be stacked. It should be noted that elements in increments of 100 refer to like elements described with respect to FIG. 1. For example, a first electronic device is referenced by 110, a second electronic device by 210, and so on.

The first electronic device 110 illustratively includes electrically conductive bottom contacts 127a, 127b in the form of electrically conductive balls. The bottom interconnect layer 220 of the second electronic device 210 is coupled to the second electrically conductive via 126a, 126b of the first electronic device 110 by way of bottom contacts 227a, 227b. The bottom interconnect layer 320 of a third electronic device 310, or IC package, is coupled to the second electrically conductive vias 226a, 226b of the second electronic device 210 by way of respective electrically conductive bottom contacts 327a, 327b. Illustratively, the third electronic device 310, as the top electronic device of the stack, does not include first and second electrically conductive vias for coupling to another stacked electronic device. Of course, additional electronic devices may be stacked, in which case, the third electronic device 310 would include first and second electrically conductive vias as described above. Other types of electronic devices may be coupled to an uppermost electronic device. Moreover, a PCB may be coupled to the bottom contacts 127a, 127b of the first electronic device 110.

Referring now to FIG. 5 a method of making an electronic device 10 is described. The method includes coupling an IC 40 to a bottom interconnect layer 20 and positioning an encapsulation material 24 on the bottom interconnect layer to surround the IC. Bottom contacts 27a, 27b are coupled to the bottom interconnect layer 20 (step a).

The method includes forming first electrically conductive vias 25a, 25b in the bottom interconnect layer 20 and second electrically conductive vias 26a, 26b in the encapsulation layer 24 (step b). Respective pairs of the first and second electrically conductive vias 25a, 26a, 25b, 26b are formed so that they are aligned and so that the cross-sectional area of each second electrically conductive via 26a, 26b is larger than the cross-sectional area of each respective first electrically conductive via 25a, 25b.

Each first electrically conductive via 25a, 25b is formed by drilling from the wafer or device 10 backside to form respective first openings 35a, 35b, as will be appreciated by those skilled in the art. In particular, each first electrically conductive via 25a, 25b is formed by drilling with a laser that does not penetrate dielectric materials of the bottom interconnect layer 20. In other words, when forming the first electrically conductive vias 25a, 25b, formation of the first openings 35a, 35b stops at the electrically conductive layer 23 of the bottom interconnect layer 20, as the laser does not penetrate the electrically conductive layer.

Each second electrically conductive via 26a, 26b is also formed by drilling from the wafer or device 10 backside to form respective second openings 36a, 36b. In particular, each second electrically conductive via 26a, 26b is formed by drilling with a laser that penetrates the encapsulation layer 24, but does not penetrate the bottom interconnect layer 20. The laser drilling forms respective second openings 36a, 36b in the encapsulation layer 24. In some embodiments, the first openings 35a, 35b may be formed before forming the second openings 36a, 36b, while in other embodiments, the second openings may be formed before the first openings.

The laser used to form the first openings 35a, 35b for the first electrically conductive vias 25a, 25b has a smaller or more focused beam so that the first electrically conductive vias each have a smaller cross-sectional area than the cross-sectional area of respective second electrically conductive vias 26a, 26b.

The first and second electrically conductive vias 25a, 26a, 25b, 26b are further formed by positioning an electrically conductive material, for example, a solder paste having one or more of tin and lead in the openings 35a, 36a, 35b, 36b (step c). The solder paste is reflowed forming combined first and second electrically conductive vias 25a, 26a, 25b, 26b each having an obloid shape (step d). In some embodiments, the combined first and second electrically conductive vias 25a, 26a, 25b, 26b may have a spherical shape.

As will be appreciated by those skilled in the art, another electronic device may be coupled to the second electrically conductive vias 26a, 26b. While a method of making a single electronic device 10 has been described, it should be noted that multiple wafers may be stacked, bonded, thinned, and diced apart to form more than one electronic device.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An electronic device comprising:
   a bottom interconnect layer having a first electrically conductive via therein;
   an integrated circuit (IC) carried by said bottom interconnect layer; and
   an encapsulation material on said bottom interconnect layer and surrounding said IC and having a second electrically conductive via therein aligned with said first electrically conductive via, said second electrically conductive via having a cross-sectional area being larger than a cross-sectional area of said first electrically conductive via.

2. The electronic device of claim 1, wherein said first electrically conductive via has a cross-sectional area in a range of 31,000-49,000 square microns.

3. The electronic device of claim 1, wherein said second electrically conductive via has a cross-sectional area in a range of 49,000-97,000 square microns.

4. The electronic device of claim 1, wherein said IC comprises a semiconductor substrate having a plurality of bond pads coupled to said bottom interconnect layer.

5. The electronic device of claim 1, wherein said encapsulation material comprises thermosetting polymer.

6. The electronic device of claim 1, said first and second electrically conductive vias comprise a tin/lead alloy.

7. The electronic device of claim 1, wherein said bottom interconnect layer comprises a plurality of dielectric layers and at least one electrically conductive layer associated therewith.

8. The electronic device of claim 7, wherein said at least one electrically conductive layer comprises a plurality of electrically conductive layers.

9. The electronic device of claim 1, further comprising a plurality of bottom contacts carried by said bottom interconnect layer.

10. The electronic device of claim 1, further comprising an IC package comprising a plurality of electrically conductive contacts coupled to respective ones of said first and second electrically conductive vias.

11. An electronic device comprising:
a bottom interconnect layer having a first electrically conductive via therein;
a plurality of bottom contacts carried by said bottom interconnect layer;
an integrated circuit (IC) comprising a semiconductor substrate having a plurality of bond pads coupled to said bottom interconnect layer; and
an encapsulation material on said bottom interconnect layer and surrounding said IC and having a second electrically conductive via therein aligned with said first electrically conductive via, said second electrically conductive via having a cross-sectional area being larger than a cross-sectional area of said first electrically conductive via.

12. The electronic device of claim 11, wherein said first electrically conductive via has a cross-sectional area in a range of 31,000-49,000 square microns.

13. The electronic device of claim 11, wherein said second electrically conductive via has a cross-sectional area in a range of 49,000-97,000 square microns.

14. The electronic device of claim 11, wherein said encapsulation material comprises thermosetting polymer.

15. The electronic device of claim 11, said first and second electrically conductive vias comprise a tin/lead alloy.

16. The electronic device of claim 11, wherein said bottom interconnect layer comprises a plurality of dielectric layers and at least one electrically conductive layer associated therewith.

17. The electronic device of claim 16, wherein said at least one electrically conductive layer comprises a plurality of electrically conductive layers.

18. The electronic device of claim 11, further comprising an IC package comprising a plurality of electrically conductive contacts coupled to respective ones of said first and second electrically conductive vias.

19. A method of making an electronic device comprising:
coupling an integrated circuit (IC) to a bottom interconnect layer;
forming a first electrically conductive via in the bottom interconnect layer;
positioning an encapsulation material on the bottom interconnect layer to surround the IC; and
forming a second electrically conductive via in the encapsulation material aligned with the first electrically conductive via, the second electrically conductive via having a cross-sectional area being larger than a cross-sectional area of the first electrically conductive via.

20. The method of claim 19, wherein the first electrically conductive via is formed to have a cross-sectional area in a range of 31,000-49,000 square microns.

21. The method of claim 19, wherein the second electrically conductive via is formed to have a cross-sectional area in a range of 49,000-97,000 square microns.

22. The method of claim 19, further comprising coupling a plurality of bottom contacts to the bottom interconnect layer.

23. The method of claim 19, further comprising coupling a plurality of electrically conductive contacts of an IC package to respective ones of the first and second electrically conductive vias.

24. The method of claim 19, wherein the first electrically conductive via is formed using a first laser, and wherein the second electrically conductive via is formed using a second laser different from the first laser.

* * * * *

UNITED STATES PATENT AND TRADEMARK OFFICE
CERTIFICATE OF CORRECTION

PATENT NO. : 8,860,228 B2
APPLICATION NO. : 13/727206
DATED : October 14, 2014
INVENTOR(S) : Jin et al.

Page 1 of 1

It is certified that error appears in the above-identified patent and that said Letters Patent is hereby corrected as shown below:

In the Claims

| | |
|---|---|
| Column 7, Line 3, Claim 6, | Delete: "said first" |
| | Insert: --wherein said first-- |
| Column 8, Line 1, Claim 15, | Delete: "said first" |
| | Insert: --wherein said first-- |

Signed and Sealed this
Fourteenth Day of July, 2015

Michelle K. Lee
*Director of the United States Patent and Trademark Office*